United States Patent
Blondin

(10) Patent No.: US 9,798,433 B2
(45) Date of Patent: Oct. 24, 2017

(54) GUARD ACCESSORY DEVICE FOR AN ELECTRONIC AND/OR COMPUTER APPARATUS, AND APPARATUS EQUIPPED WITH SUCH AN ACCESSORY DEVICE

(71) Applicant: FOGALE NANOTECH, Nimes (FR)

(72) Inventor: Christophe Blondin, Nimes (FR)

(73) Assignee: QUICKSTEP TECHNOLOGIES LLC, Wilmington, DE (US)

( * ) Notice: Subject to any disclaimer, the term of this patent is extended or adjusted under 35 U.S.C. 154(b) by 0 days.

(21) Appl. No.: 14/905,778

(22) PCT Filed: Jul. 16, 2014

(86) PCT No.: PCT/EP2014/065258
§ 371 (c)(1),
(2) Date: Jan. 15, 2016

(87) PCT Pub. No.: WO2015/007781
PCT Pub. Date: Jan. 22, 2015

(65) Prior Publication Data
US 2016/0179247 A1    Jun. 23, 2016

(30) Foreign Application Priority Data
Jul. 18, 2013    (FR) ...................................... 13 57096

(51) Int. Cl.
*G06F 3/044*    (2006.01)
*G06F 1/16*    (2006.01)
*G06F 3/039*    (2013.01)

(52) U.S. Cl.
CPC ............ *G06F 3/044* (2013.01); *G06F 1/1626* (2013.01); *G06F 1/1633* (2013.01);
(Continued)

(58) Field of Classification Search
None
See application file for complete search history.

(56) References Cited

U.S. PATENT DOCUMENTS 5,483,261 A    1/1996    Yasutake
5,488,204 A    1/1996    Mead et al.
(Continued)

FOREIGN PATENT DOCUMENTS

CN    1479891 A    3/2004
EP    2 207 076 A2    7/2010
(Continued)

OTHER PUBLICATIONS

IBM Technical Disclosure Bulletin. (Jun. 1, 1994). "Personal Communicator Configurations," International Business Machines Corp., (Thornwood), US. vol. 37, No. 6A, pp. 449-453.
(Continued)

*Primary Examiner* — Antonio Xavier
(74) *Attorney, Agent, or Firm* — Morrison & Foerster LLP

(57) ABSTRACT

An accessory device for use with an electronic user apparatus is disclosed. The electronic user apparatus includes at least one capacitive sensor for detection of at least one control object with respect to a control surface, and at least one apparatus guard placed at an alternating guard potential ($V_G$), different from a ground potential of the at least one control object, and identical to a potential of the capacitive sensor. The accessory device includes at least one accessory guard capable of being set to the alternating guard potential ($V_G$) by coupling with the electronic user apparatus.

15 Claims, 4 Drawing Sheets

(52) U.S. Cl.
CPC .. *G06F 3/0395* (2013.01); *G06F 2203/04107* (2013.01); *H03K 2217/960765* (2013.01)

(56) References Cited

U.S. PATENT DOCUMENTS

| | | | |
|---|---|---|---|
| 5,825,352 | A | 10/1998 | Bisset et al. |
| 5,835,079 | A | 11/1998 | Shieh |
| 5,844,506 | A | 12/1998 | Binstead |
| 5,880,411 | A | 3/1999 | Gillespie et al. |
| 6,009,153 | A | 12/1999 | Houghton et al. |
| 6,188,391 | B1 | 2/2001 | Seely et al. |
| 6,310,610 | B1 | 10/2001 | Beaton et al. |
| 6,323,846 | B1 | 11/2001 | Westerman et al. |
| 6,668,897 | B2 | 12/2003 | Gunn |
| 6,690,387 | B2 | 2/2004 | Zimmerman et al. |
| 7,010,333 | B2 | 3/2006 | Trively |
| 7,015,894 | B2 | 3/2006 | Morohoshi |
| 7,046,230 | B2 | 5/2006 | Zadesky et al. |
| 7,176,894 | B2 | 2/2007 | Ostergård et al. |
| 7,184,064 | B2 | 2/2007 | Zimmerman et al. |
| 7,570,064 | B2 | 8/2009 | Roziere |
| 7,614,008 | B2 | 11/2009 | Ording |
| 7,620,174 | B1 | 11/2009 | Bick |
| 7,663,607 | B2 | 2/2010 | Hotelling et al. |
| 7,800,592 | B2 | 9/2010 | Kerr et al. |
| 7,808,479 | B1 | 10/2010 | Hotelling et al. |
| 7,844,914 | B2 | 11/2010 | Andre et al. |
| 8,149,002 | B2 | 4/2012 | Ossart et al. |
| 8,159,213 | B2 | 4/2012 | Roziere |
| 8,239,784 | B2 | 8/2012 | Hotelling et al. |
| 8,471,822 | B2 | 6/2013 | Lightenberg |
| 8,479,122 | B2 | 7/2013 | Hotelling et al. |
| 8,570,288 | B2 | 10/2013 | Lai et al. |
| 8,770,033 | B2 | 7/2014 | Roziere |
| 8,917,256 | B2 * | 12/2014 | Roziere ............... G06F 3/044 178/18.06 |
| 9,035,903 | B2 | 5/2015 | Binstead |
| 9,063,620 | B2 | 6/2015 | Chan et al. |
| 9,151,791 | B2 * | 10/2015 | Roziere ............... G06F 3/044 |
| 9,292,141 | B2 | 3/2016 | Zhong et al. |
| 2004/0135919 | A1 | 7/2004 | Kim et al. |
| 2005/0068304 | A1 | 3/2005 | Lewis et al. |
| 2006/0026536 | A1 | 2/2006 | Hotelling et al. |
| 2006/0033724 | A1 | 2/2006 | Chaudhri et al. |
| 2006/0053387 | A1 | 3/2006 | Ording |
| 2006/0085757 | A1 | 4/2006 | Andre et al. |
| 2006/0097733 | A1 | 5/2006 | Roziere |
| 2006/0181517 | A1 | 8/2006 | Zadesky et al. |
| 2006/0197750 | A1 | 9/2006 | Kerr et al. |
| 2006/0197753 | A1 | 9/2006 | Hotelling et al. |
| 2006/0227114 | A1 * | 10/2006 | Geaghan ............... G06F 3/0418 345/173 |
| 2007/0164756 | A1 * | 7/2007 | Lee ............... H03K 17/962 324/662 |
| 2008/0062139 | A1 * | 3/2008 | Hotelling ............... G02F 1/13338 345/173 |
| 2008/0165139 | A1 | 7/2008 | Hotelling et al. |
| 2008/0245582 | A1 | 10/2008 | Bytheway |
| 2009/0033343 | A1 * | 2/2009 | Reynolds ............... H03K 17/955 324/688 |
| 2009/0218310 | A1 | 9/2009 | Zu et al. |
| 2010/0044122 | A1 | 2/2010 | Sleeman et al. |
| 2011/0007021 | A1 * | 1/2011 | Bernstein ............... G06F 3/0416 345/174 |
| 2011/0169783 | A1 * | 7/2011 | Wang ............... G06F 3/0412 345/176 |
| 2011/0261010 | A1 * | 10/2011 | Nishitani ............... G06F 3/044 345/174 |
| 2011/0279383 | A1 * | 11/2011 | Wilson ............... G06F 3/041 345/173 |
| 2011/0285661 | A1 * | 11/2011 | Hotelling ............... G06F 3/0418 345/174 |
| 2012/0056824 | A1 | 3/2012 | Liu et al. |
| 2012/0057312 | A1 | 3/2012 | Yoo et al. |
| 2012/0074961 | A1 * | 3/2012 | Herrmann ............... G06F 3/044 324/658 |
| 2012/0187965 | A1 * | 7/2012 | Roziere ............... G06F 3/044 324/688 |
| 2012/0223901 | A1 | 9/2012 | Kim et al. |
| 2012/0235927 | A1 | 9/2012 | Ho et al. |
| 2013/0062179 | A1 * | 3/2013 | Ye ............... G06F 3/041 200/512 |
| 2013/0090873 | A1 * | 4/2013 | Lundstrum ............... H03K 17/962 702/64 |
| 2013/0135233 | A1 | 5/2013 | Wang et al. |
| 2013/0170152 | A1 | 7/2013 | Wu |
| 2013/0222323 | A1 * | 8/2013 | McKenzie ............... G06F 1/169 345/174 |
| 2013/0241871 | A1 | 9/2013 | Huang et al. |
| 2013/0314625 | A1 | 11/2013 | Tsai et al. |
| 2013/0335368 | A1 | 12/2013 | Lee |
| 2014/0002378 | A1 | 1/2014 | Kim et al. |
| 2014/0085551 | A1 | 3/2014 | Koo et al. |
| 2014/0092041 | A1 | 4/2014 | Ih |
| 2014/0111222 | A1 * | 4/2014 | Aubauer ............... H03K 17/962 324/658 |
| 2014/0202742 | A1 | 7/2014 | Jones et al. |
| 2014/0204284 | A1 | 7/2014 | Yao et al. |
| 2014/0232665 | A1 | 8/2014 | Lee et al. |
| 2014/0266255 | A1 * | 9/2014 | More ............... G01N 27/221 324/679 |
| 2014/0362508 | A1 * | 12/2014 | Griffin ............... G06F 1/1626 361/679.11 |
| 2015/0068897 | A1 * | 3/2015 | Neel ............... G06F 3/044 204/407 |
| 2015/0212609 | A1 | 7/2015 | Tung |
| 2016/0179247 | A1 | 6/2016 | Blondin |
| 2016/0291730 | A1 * | 10/2016 | Roziere ............... G06F 1/1656 |

FOREIGN PATENT DOCUMENTS

| | | |
|---|---|---|
| GB | 2 299 394 A | 10/1996 |
| GB | 2 348 075 A | 9/2000 |
| JP | 2000-163031 A | 6/2000 |
| JP | 2002-342033 A | 11/2002 |
| JP | 2003-067128 A | 3/2003 |
| WO | WO-01/28189 A1 | 4/2001 |
| WO | WO-02/35333 A1 | 5/2002 |
| WO | WO-2005/053287 A1 | 6/2005 |
| WO | WO-2005/114369 A2 | 12/2005 |
| WO | WO-2005/114369 A3 | 12/2005 |
| WO | WO-2011/015794 A1 | 2/2011 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

GUARD ACCESSORY DEVICE FOR AN ELECTRONIC AND/OR COMPUTER APPARATUS, AND APPARATUS EQUIPPED WITH SUCH AN ACCESSORY DEVICE

CROSS-REFERENCE TO RELATED APPLICATIONS

This application is a National Phase application under 35 U.S.C. §371 of International Application No. PCT/EP2014/065258, filed Jul. 16, 2014, which claims the priority benefit of French Patent Application No. 1357096, filed Jul. 18, 2013, the contents of which are hereby incorporated by reference in their entireties for all intended purposes.

TECHNICAL DOMAIN

The present invention concerns a guarded accessory device for an electronic and/or computer apparatus comprising a means of capacitive detection of one or more control objects. It also concerns an electronic and/or computer apparatus equipped with such an accessory device The domain of the invention is more particularly, although not limited to, contactless man-machine interfaces implementing a capacitive detection technology, and more particularly a capacitive detection technology implementing a guard plane of capacitive electrodes.

STATE OF THE ART

More and more portables apparatuses, such as tablets and smart phones, are equipped with a touchscreen and offer man-machine interface functions. Such apparatuses utilize transparent touch pads as interface on the screens, and opaque at a control surface disposed at the periphery of the screen.

Most of such pads utilize capacitive technology. This currently very widespread technology makes it possible to detect one or more objects (fingers, stylus, etc.) in contact on the touch-sensitive surface.

Known from the patent FR 2 893 711, filed by the Applicant, is a capacitive solution enabling the two-dimensional position of a finger to be detected on a control surface at a distance of several centimeters, and of a hand at more than 10 cm.

Also known is the patent application, filed by the Applicant, published under number FR 2 971 066 A1, which describes an interface making it possible to determine, in addition to the two-dimensional position of an object in the plane formed by a control surface, a vertical distance between the control surface and the object, and to trigger specific functions based on the value of said vertical distance, such as intensive browsing.

However, the detection range and the functioning of all of such detection interfaces depends on the electrostatic environment of the control surface. The proximity detection range is for example degraded when the apparatus is held in the user's hand or when the apparatus is placed on a table. In these situations, the hand or the table is polarized to the ground of the apparatus and deforms the lines of electrostatic field generated by the electrodes of the control surface, degrading the performance and functioning of the detection interface.

There are hardware solutions (guard electrodes) or software solutions (calculation algorithms) to limit or attenuate the interferences between the capacitive electrodes and the environment of the apparatus, but such solutions do not compensate for the loss of detection range of the touch-sensitive interface.

A purpose of the present invention is to remedy the aforementioned disadvantages.

Another purpose of the present invention is to propose an accessory device for a user apparatus comprising a capacitive detection means making it possible to reduce the effects of interfaces, caused by the electrostatic environment of said apparatus, degrading the detection performance of said apparatus.

Finally, another purpose of the present invention is to propose an accessory device for a user apparatus comprising a capacitive detection means making it possible to improve the detection range and/or the precision of detection of said apparatus, even when it is held in the hand or placed on a surface.

DISCLOSURE OF THE INVENTION

At least one of these objectives is achieved by an accessory device for an electronic and/or computer apparatus, called user apparatus, said user apparatus comprising:
- at least one contactless means of capacitive detection of at least one control object with respect to a control surface, and
- at least one means, called guard apparatus, placed at an alternating potential, called guard, different from a ground potential, of said at least one control object, and substantially identical to the potential of said at least one capacitive detection means;

said accessory device comprising at least one means, called accessory guard, intended to be set at a potential similar or identical to said guard potential by coupling with said user apparatus.

Thus, the accessory device comprises a guard, disposed at a potential substantially identical to the guard potential utilized in the user apparatus to guard the capacitive detection means. The guard formed in the accessory device constitutes a barrier that attenuates the electrostatic interferences caused by the electrostatic environment of said apparatus which has been degrading the detection performance of said apparatus, particularly when the apparatus is placed on a surface such as a table or when the apparatus is held in the hand in order to be used.

Consequently, the accessory device according to the invention enables the detection performance of the user apparatus to be improved, and in particular the capacitive detection means, and thus increase the detection range and/or the detection precision of said apparatus, compared to existing solutions, in a given configuration of use.

According to the invention, the accessory guard means can preferably form, at least in part, an electrically conductive plane.

Such a guard means can be obtained by a matrix of electrically conductive electrodes forming a plane or by a layer of a conductive material.

Indeed, according to a particularly preferred characteristic of the device according to the invention, the accessory guard means can be integrated, at least in part, in/on a wall/surface, in particular one that is substantially plane, of said device.

During use, such a wall/surface can be disposed next to the detection means of the user apparatus.

Moreover, the accessory device or the accessory guard means can be arranged in such a way that, in one configuration of use, the accessory guard means forms a plane substantially parallel to a plane formed by the control surface, and in particular to a plane formed by the capacitive detection means, forming a zero angle therewith.

Preferably, the accessory guard means can have a width, and/or a length greater than that of the touch-sensitive surface, and/or that of the user apparatus, in particular when the accessory guard means forms or is integrated into a wall provided to accommodate the user apparatus.

For example, when the accessory device is a wireless charger for charging the user apparatus and the accessory guard means is disposed on/in a wall of the device, then the accessory guard means has a width, and/or a length greater than that of the user apparatus.

In a particular embodiment, the accessory device according to the invention can comprise at least one attachment means enabling said accessory device to be removably attached to the user apparatus.

For example, when the accessory device is a protective case for the user apparatus, then it can advantageously comprise attachment means to secure the case to the user apparatus, particularly in a way that is removable.

In a particular embodiment, the device according to the invention can comprise at least one coupling means, called accessory, intended to produce a coupling, wired or wireless, of said accessory device to said user apparatus in order to place said accessory guard means at a potential similar or identical to the guard potential.

Such a coupling means can be arranged to cooperate with a coupling means, called apparatus, provided in the user apparatus to perform such a coupling.

Such a coupling means can be in the form of a module provided to receive a synchronization/potential signal from the user apparatus and to generate or control the generation of an alternating guard potential.

In a simpler form, the coupling means can be a wired means connected to the user apparatus and intended to carry a synchronization signal for the guard potential or the guard potential signal directly from the user apparatus to the accessory apparatus.

When the coupling between the accessory device and the user apparatus is wireless, the coupling means can produce a capacitive coupling or an inductive coupling, that is, by induction of the coupling potential in the accessory guard means by one or more inductances.

Alternatively or additionally, the coupling means can comprise a wired connection/interface, particularly one that is removable, between the accessory device and the user apparatus, said wired connection/interface carrying a synchronization signal of the alternating guard potential and/ or the alternating guard potential directly.

According to the invention, the accessory device can be in the form of:
- a mat on which the apparatus can be placed during use: in this case the guard means can be disposed in the thickness of the mat or on the upper surface of the mat;
- a wireless charger comprising an accommodation surface on which to place the apparatus while it is charging; in this case the guard means can be disposed beneath/in/on/around the accommodation surface of the charger;
- a protection means for the user apparatus, such as a case or a cover: in this case the guard means can be disposed beneath/in/on a wall of the case or cover, in particular next to a surface that is facing the same direction as the capacitive detection means;
- a data entry means, such as a keyboard: in this case the guard means can be disposed in the thickness of the keyboard or on the surface of the keyboard comprising the input means; or
- a support comprising a housing/accommodation surface in/on which the apparatus can be placed.

According to another aspect of the invention, an electronic and/or computer apparatus is proposed, called the user apparatus, comprising:
- at least one contactless means of capacitive detection of at least one control object with respect to a control surface,
- at least one means, called apparatus guard, placed at an alternating potential called guard, different from a potential, called ground, of the said at least one control object, and substantially identical to the potential of said at least one capacitive detection means, and
- an accessory device according to the invention.

The apparatus according to the invention can comprise at least one coupling means, called apparatus, intended to produce a coupling, wired or wireless, of said apparatus with the accessory device, in particular by cooperating with an accessory coupling means.

The coupling means can be a module furnishing, by wired or wireless means, a synchronization signal of the guard potential or the guard potential directly to the accessory apparatus.

The coupling module can comprise a capacitive or inductive coupling means, or a wired connection/interface to be connected to the accessory means, in particular a coupling means of the accessory device.

According to the invention, the capacitive detection means can advantageously comprise a plurality of capacitive electrodes, called measurement, at least one of which, and preferably each of them, is maintained at the guard potential by the apparatus guard means.

Each of said electrodes can perform a measurement/detection of the control object by the technology called "self capacitance" or "mutual capacitance."

According to the invention, the detection means can be integrated into/onto the control surface.

According to a particular embodiment, the control surface can be formed by a wall/surface/face of the apparatus according to the invention.

According to a particularly preferred embodiment, the control surface can be a touch-sensitive surface.

Still in accordance with the particularly preferred embodiment, the apparatus according to the invention can comprise a display screen. In this case the capacitive detection means can be integrated into/onto/around/at the periphery of/behind the display screen in such a way that the control surface is formed by at least one part of said display screen and/or by a plane parallel to said display screen.

The capacitive detection means can be opaque or transparent, especially when it is positioned in/on/behind a display screen.

The apparatus according to the invention can be a computer, a telephone or smart phone, a game console, a PDA, a touchpad, etc.

DESCRIPTION OF THE FIGURES AND EMBODIMENTS

Other advantages and characteristics will appear from examining the following detailed description of non-limiting examples, and from the appended drawings in which:

FIGS. 1-3 are schematic representations of different non-limiting embodiments of an accessory device according to the invention; and FIGS. 4-9 are schematic representations of non-limiting examples of accessory devices and user apparatuses according to the invention.

It is clear that the embodiments that will be described in the following are in no way limiting. In particular, variants of the invention may be imagined that comprise only a selection of characteristics described below isolated from other described characteristics, if said selection of characteristics is sufficient to confer a technical advantage or to differentiate the invention with respect to the state of the prior art. Said selection comprises at least one preferably functional characteristic without structural details, or with only one part of the structural details if said part alone is sufficient to confer a technical advantage or to differentiate the invention with respect to the state of the prior art.

In particular, all variants and all embodiments described can be combined with each other if there is no technological obstacle to such combination.

In the figures, the elements common to several figures preserve the same reference.

We will now describe different examples of an electronic/computer apparatus according to the invention implementing different embodiments of a device according to the invention.

FIG. 1 is a schematic representation of a first embodiment of a guard accessory device coupled according to the invention.

The accessory device 100, represented in FIG. 1, is in a substantially flat form, and can be rigid or flexible.

The accessory device, in particular the case or housing of the device 100, can be produced from a plastic or foam material, or any other electrically non-conductive material.

The accessory device is intended to be used with a user apparatus 102 comprising a set of capacitive sensors 104, and in particular capacitive electrodes, intended to detect at least one control object in contact with and/or at a distance from a control surface 106, which can for example be disposed in/on/beneath a display screen (not shown) of the user apparatus 102.

The user apparatus 102 comprises a guard plane 108, called apparatus, electrically conductive, used to guard the capacitive sensors 104, and intended to be placed at an alternating guard potential $V_G$. The guard plane 108 is positioned in such a way that the capacitive sensors 104 are disposed between the control surface 106 and the guard plane 108.

The accessory device 100 comprises a layer 110 of electrically conductive material, for example copper or any other electrically conductive material, and intended to be placed at an alternating guard potential $V_G$ and to constitute a guard plane, called accessory.

The device 100 further comprises a coupling module 112, called accessory, for performing a coupling of said accessory device 100 to the user apparatus 102 in order to apply the alternating guard potential $V_G$ in a manner that is synchronized with the user apparatus 102, and in particular with the apparatus guard plane 108.

In the example shown in FIG. 1, the accessory coupling module 112 wirelessly performs a coupling with the user apparatus 102 by cooperation with a coupling module 114, called apparatus, disposed in the user apparatus 102. The accessory coupling module 112 receives directly from the apparatus coupling module 114 the alternating guard potential signal $V_G$ and applies it to the accessory guard plane 110.

FIG. 2 is a schematic representation of a second embodiment of a guard accessory device coupled according to the invention.

The device 200 represented in FIG. 2 comprises all of the elements of the device 100 represented in FIG. 1. In addition, the device 200 comprises a means 202 of generating the guard potential $V_G$.

In the example represented in FIG. 2, the accessory coupling means 112 of the device 200 receives from the apparatus coupling module 114 a synchronization signal of the guard potential and not the guard potential signal. Depending on said synchronization signal, the accessory coupling module 112 controls the module 202 for generation of the guard potential which generates the alternating guard potential signal $V_G$ and applies it to the accessory guard plane 110 in a way that is synchronized.

In the examples represented in FIGS. 1 and 2, the accessory device has a width and/or a length greater than the width and/or the length of the user apparatus 102.

In the examples represented in FIGS. 1 and 2, the guard plane 110 is disposed in the thickness of the device. Alternatively it can be disposed on or formed by the face of the device entering into contact with the user device or the face opposite thereto.

In the examples represented in FIGS. 1 and 2, the wireless coupling between the accessory device and the user apparatus can be accomplished by capacitive coupling, by a wireless connection such as Wi-Fi, Bluetooth, etc.

In the examples represented in FIGS. 1 and 2, the wireless coupling between the accessory device and the user apparatus can be replaced or supplemented by a physical or wired electrical connection.

In the examples represented in FIGS. 1 and 2, the accessory apparatus can be:
- a mat or a means on which the user apparatus 102 can be placed during its use,
- a wireless charger comprising an accommodation surface intended to have the apparatus placed thereon in order to be charged: in this case the guard means can be disposed beneath/in/on the accommodation surface of the charger. Moreover, in this case the metal of which the guard is composed must be sufficiently transparent to the magnetic field generated by the charger. A very thin layer of copper or a sufficiently resistive metal can be used to limit the loss of the field emitted by the Foucault current (skin effect).
- a means of protection for the user apparatus, such as a case or a cover, or
- a data entry means such as a keyboard.

FIG. 3 is a schematic representation of a third embodiment of a guard accessory device coupled according to the invention.

The device 300 represented in FIG. 3 comprises all of the elements of the device 100 represented in FIG. 1, except for the accessory coupling module 112 and apparatus coupling module 114.

The accessory coupling module 112 is replaced by an accessory connection interface 302 and the apparatus coupling module is replaced by an apparatus connection interface 304. The accessory connection and apparatus connection interfaces are arranged and chosen to be interconnected so as to create an electrically conductive link.

In this example, a guard potential $V_G$ is generated in the user apparatus. Said guard potential $V_G$ is applied to the apparatus guard plane 108, and can be removed by means of the apparatus connection interface 304, said interface either being connected to the apparatus guard plane 108 or to a module (not shown) for generating the guard potential $V_G$ in the user apparatus 102.

When the accessory connection interface 302 and apparatus interface 304 are interconnected, the accessory connection interface 302 removes the guard potential $V_G$ from the apparatus connection interface 304, and applies it to the accessory guard plane 110.

In other words, there is a physical (or wired) electrical connection between the accessory guard plane 110 and either the apparatus guard plane 108 or a module for generating the guard potential $V_G$.

Recognition can be provided of the presence of the accessory 110 in order to take into account the new environment. Indeed, said guard supplement modifies the response of the sensor 104 and it is advantageous to take into account this new response in order to optimize touchless performance.

Said recognition can be accomplished by the physical connection but also by the measurement of infinite capacitances (without the presence of an object nearby). Said infinite capacitances are smaller with an addition of an accessory connected to the guard.

FIG. 4 is a schematic representation of an example of user apparatus according to the invention provided with an accessory device according to the invention.

In the example represented in FIG. 4, the accessory device is a protective cover 400 and the user apparatus is a smart phone 402 provided with a transparent touch-sensitive capacitive pad placed on/beneath/in a display screen 404.

The protective cover 400 comprises a part 406 that is fixed with respect to the smart phone 402 and a part 408 that is movable in rotation between a folded position in which it is in contact with the display screen 404 and an unfolded position in which it forms a non-zero angle with the plane formed by the display screen 404, and more particularly an angle equal to or greater than 90°, and more particularly an angle of 180°.

The accessory guard plane 410 is inserted in the thickness of the protective cover 400 or on the upper face of the protective cover 400, i.e. the face of the protective cover next to the smart phone 402, over the entirety of the protective cover 400 or only in the movable part 408.

The protective cover 402 is removably attached to the smart phone 402 by attachment means 412 that utilize clamping and/or clips to secure to one or more edges of the smart phone.

The coupling between the cover 400 and the smart phone 402 can be achieved according to any of the embodiments described above with reference to FIGS. 1-3.

FIG. 5 is a schematic representation of another example of user apparatus according to the invention fitted with an accessory device according to the invention.

In the example represented in FIG. 5, the accessory device is a protective cover 500 and the user apparatus is a touch tablet 502 provided with a transparent capacitive touch-sensitive pad arranged on/beneath/in a display screen 504.

The protective cover 500 comprises a part 506 that is fixed with respect to the tablet 502 and a part 508 that is movable in rotation between a folded position and an unfolded position as described above.

The accessory guard plane 510 is inserted in the thickness of the protective cover 500 or on the upper face of the protective cover 500 over the entirety of the protective cover 500 or only in the movable part 508.

The coupling between the cover 500 and the tablet 502 can be achieved according to any one of the embodiments described above with reference to FIGS. 1-3.

The protective cover 500 is removably attached to the touch tablet 502 by attachment means 512 that utilize clamping and/or clips to secure to one or more edges of the tablet 502, particularly at the corners of the tablet 502.

FIG. 6 is a schematic representation of another example of user apparatus according to the invention fitted with an accessory device according to the invention.

In the example represented in FIG. 6, the accessory device is a keyboard 600 and the user apparatus is a touch-sensitive tablet 602 provided with a transparent capacitive touch-sensitive pad arranged on/beneath/in a display screen 604.

The keyboard 600 is movable with respect to the tablet 602 by rotation around an axis parallel to one of the sides of the tablet 602, between a folded position and an unfolded position as described above.

The accessory guard plane 610 is inserted into the thickness of the keyboard 600 or on the upper face of the keyboard 600, over the entirety of the keyboard 600 or only in the part of the keyboard 600 closest to the tablet 602.

The coupling between the keyboard 600 and the tablet 602 can be achieved according to any one of the embodiments described above with reference to FIGS. 1-3.

The keyboard 600 is removably attached to the touch tablet 602 by magnetic attachment means 612 positioned against one of the sides of the tablet 502.

FIG. 7 is a schematic representation of another example of user apparatus according to the invention and of an accessory device according to the invention.

In the example represented in FIG. 7, the accessory device is a wireless charger 700 for smart phone and tablet and the user apparatus is a smart phone 702 provided with a transparent capacitive touch-sensitive pad arranged on/beneath/in a display screen 704.

The wireless charger 700 comprises an accommodation surface 706 on which to place the smart phone or tablet to be charged.

The accessory guard plane 710 is inserted in/beneath/on the accommodation surface 706 over the entirety of the accommodation service 706 or only on a part of the wireless charger 700.

The coupling between the charger 700 and the smart phone 702 can be achieved according to any one of the embodiments described above with reference to FIGS. 1-3, and preferably wirelessly.

Figure 8:
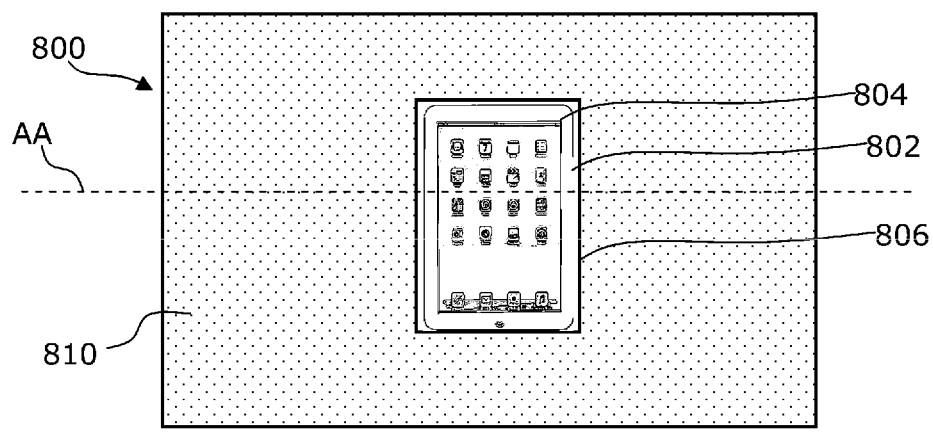
FIG. 8 is a schematic representation of another example of user apparatus according to the invention and of an accessory device according to the invention.
Figure 9:
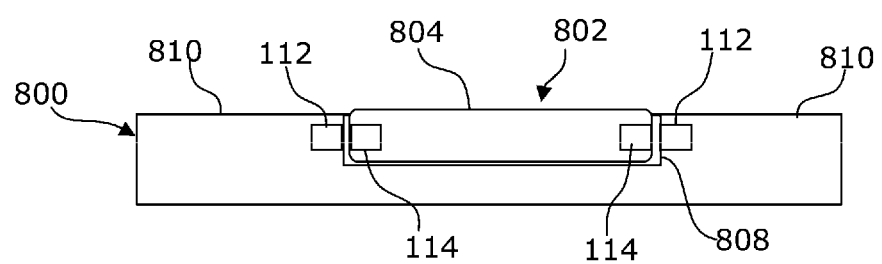
FIG. 9 is a representation of the apparatus and of the device of FIG. 8 in a cross-sectional view along the axis "AA".

In the example represented in FIGS. 8 and 9, the accessory device is a tablet support 800 and the user apparatus is a tablet 802 provided with a transparent capacitive touch-sensitive pad arranged on/beneath/in a display screen 804.

The support 800 comprises a housing/accommodation surface 806 on which to place the tablet 802.

The accessory guard plane is disposed around the accommodation housing 806, over the entire periphery of the accommodation surface housing 806. Alternatively, the accessory guard plane 810 can be disposed around only a part of the periphery of the accommodation housing 806.

The coupling between the device 800 and the tablet 802 is achieved wirelessly by means of one or more coupling means 114 disposed on/in the edge or edges of the tablet 802, and cooperating with one or more coupling means 112 disposed on/in the edge or edges of the accommodation housing 806, as represented in FIG. 9.

Figure 1:
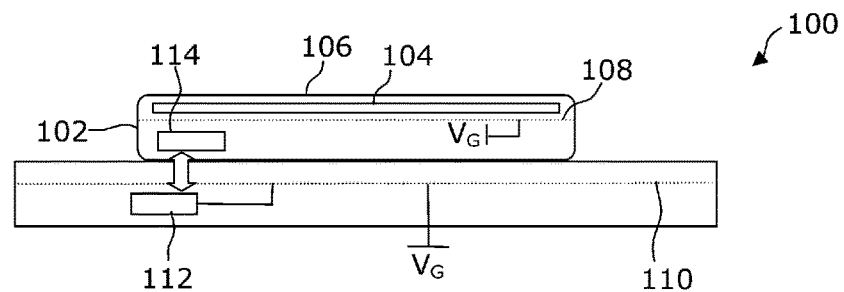
Figure 2:
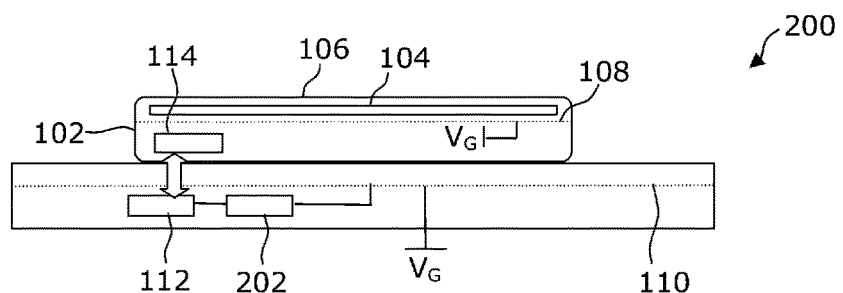
Figure 3:
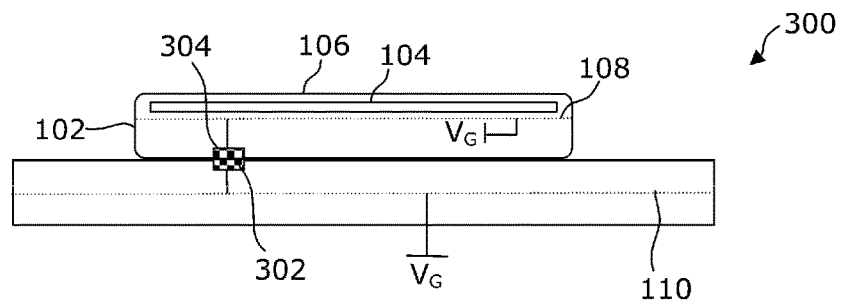
Figure 4:
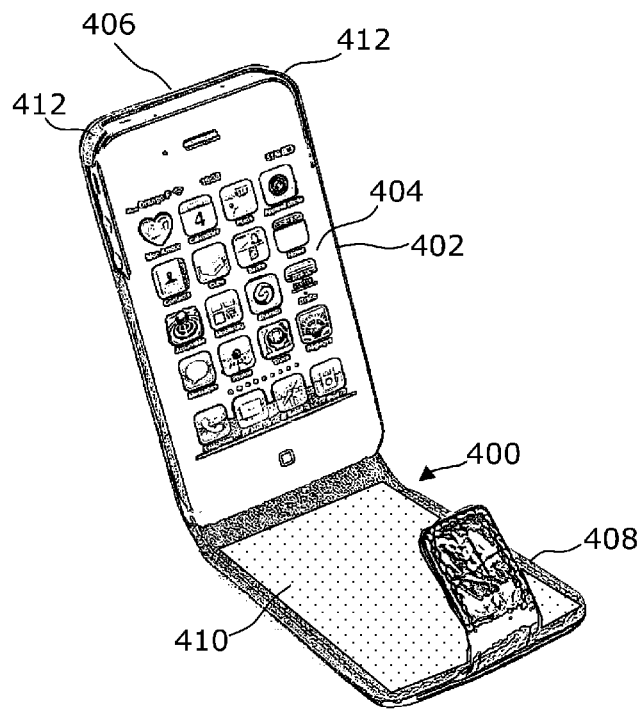
Figure 5:
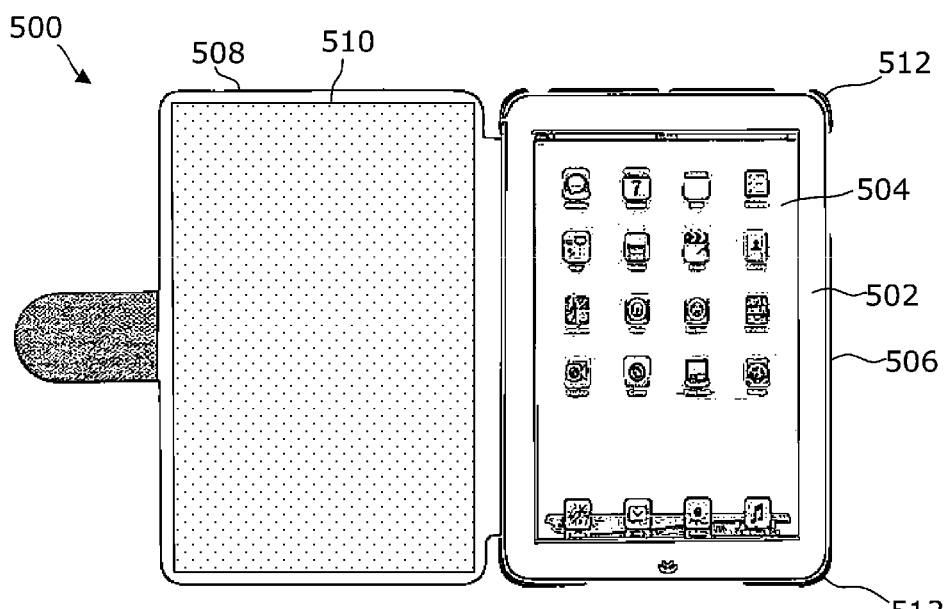
Figure 6:
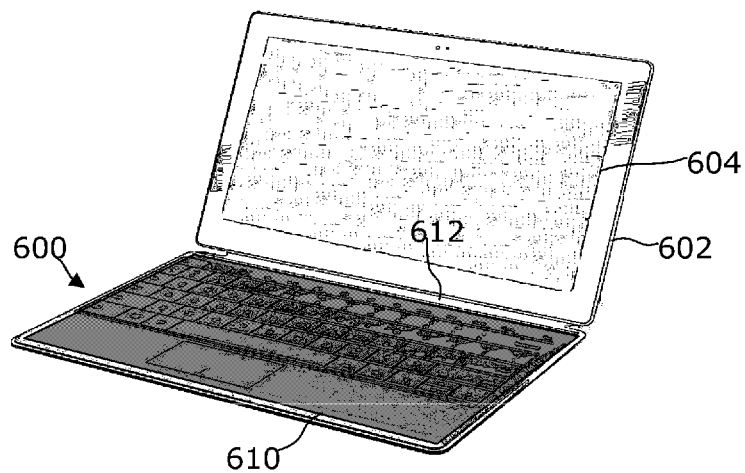
Figure 7:
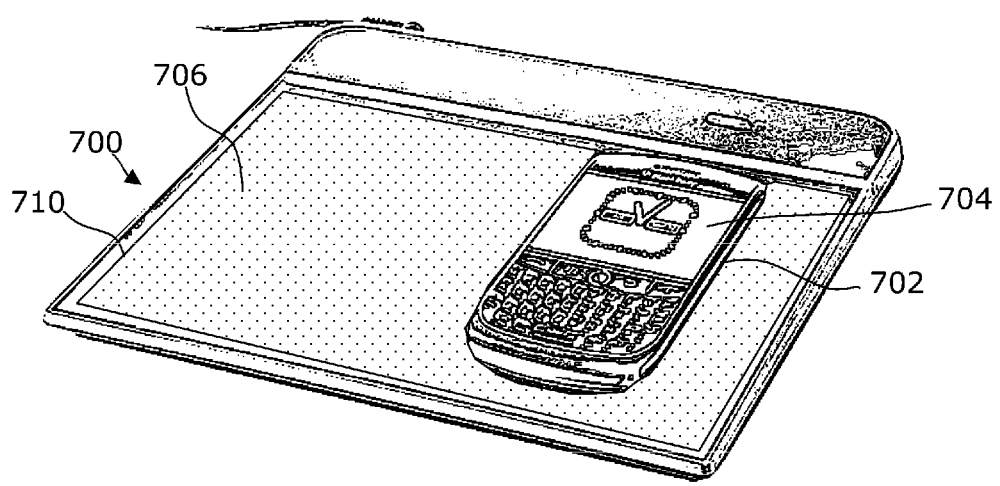

Alternatively, the coupling between the device 800 and the tablet can be achieved according to any one of the embodiments described above with reference to FIGS. 1-3.

Of course, the invention is not limited to the examples that have just been described, and numerous adjustments can be made to said examples without going beyond the scope of the invention.

The invention claimed is:

1. An accessory device for use with an electronic apparatus, said user apparatus including
   at least one capacitive sensor for detection of at least one control object with respect to a control surface, and
   at least one apparatus guard, placed at an alternating guard potential ($V_G$), different from a ground potential, of said at least one control object, and referenced to a potential of said at least one capacitive sensor,
   characterized in that said accessory device comprises: at least one accessory guard capable of being set to said alternating guard potential ($V_G$) by coupling with said user apparatus.

2. The accessory device according to claim 1, characterized in that the accessory guard forms, at least in part, an electrically conductive plane.

3. The accessory device according to claim 1, characterized in that the accessory guard is integrated, at least in part, with a surface that is substantially in plane with said device.

4. The accessory device according to claim 1, characterized in that in use, the accessory guard is designed to form a plane substantially parallel to the control surface.

5. The accessory device according to claim 1, characterized in that the accessory guard has at least one of a width and length greater than that of at least one of the control surface and the user apparatus.

6. The accessory device according to claim 1, characterized in that the accessory device comprises at least one attachment means enabling said device to be removably attached to the user apparatus.

7. The accessory device according to claim 1, characterized in that the accessory device comprises at least one coupling interface capable of providing a coupling, wired or wireless, of said device to said apparatus in order to place said accessory guard at a potential substantially identical to the guard potential ($V_G$).

8. The accessory device according to the preceding claim 7, characterized in that the coupling interface performs a capacitive coupling.

9. The accessory device according to claim 7, characterized in that the coupling interface comprises a removable wired connection between said device and the user apparatus, said wired connection carrying a synchronization signal of the alternating guard potential.

10. The accessory device according to claim 1, characterized in that the accessory device is in the form of one of:
    a mat on which the apparatus can be placed during use,
    a wireless charger comprising a surface on which to place the apparatus while the is charging;
    a protection means for the user apparatus,
    a data entry means; or
    a support comprising a housing/accommodation surface which the apparatus can be placed.

11. The accessory device according to claim 1, the accessory device incorporated with an electronic apparatus, the electronic apparatus comprising the user apparatus.

12. The accessory device according to claim 11, characterized in that the electronic apparatus comprises at least one coupling means interface capable of providing a coupling, wired or wireless, of said user apparatus with the accessory device in order to place said accessory guard at a potential substantially identical to the guard potential ($V_G$).

13. The accessory device according to any one of claim 11, characterized in that the at least one capacitive sensor is integrated into/onto the control surface.

14. The accessory device according to claim 13, characterized in that the control surface is a touch-sensitive surface.

15. The accessory device according to claim 11, characterized in that the user apparatus comprises a display screen, and the at least one capacitive sensor is integrated with display screen in such a way that the control surface is formed by at least one of a part of said display screen a plane parallel to said display screen.

* * * * *